(12) United States Patent
Byrd et al.

(10) Patent No.: US 7,564,389 B1
(45) Date of Patent: Jul. 21, 2009

(54) DISCRETE-TIME, SINGLE-AMPLIFIER, SECOND-ORDER, DELTA-SIGMA ANALOG-TO-DIGITAL CONVERTER AND METHOD OF OPERATION THEREOF

(75) Inventors: Russell G. Byrd, McKinney, TX (US); Kye-Shin Lee, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/119,658

(22) Filed: May 13, 2008

(51) Int. Cl.
*H03M 3/00* (2006.01)
(52) U.S. Cl. .................... 341/143; 341/155
(58) Field of Classification Search .......... 341/143–155
See application file for complete search history.

(56) References Cited

U.S. PATENT DOCUMENTS

| 6,111,531 | A | * | 8/2000 | Farag | 341/143 |
| 6,661,362 | B2 | * | 12/2003 | Brooks | 341/143 |
| 6,930,624 | B2 | * | 8/2005 | Hezar et al. | 341/143 |
| 6,998,910 | B2 | * | 2/2006 | Hezar et al. | 341/143 |
| 7,034,728 | B2 | * | 4/2006 | Luh et al. | 341/143 |
| 2004/0169596 | A1 | | 9/2004 | Koh | |
| 2005/0116850 | A1 | | 6/2005 | Hezar et al. | |

OTHER PUBLICATIONS

Bosco H. Leung, "Architectures for Multi-Bit Oversampled A/D Converter Employing Dynamic Element Matching Techniques" IEEE International Symposium on Circuits and Systems, pp. 1657-1660, May 1991.
Rex T. Baird, et al., "Improved Delta Sigma DAC Linearity Using Data Weighted Averaging" IEEE International Symposium on Circuits and Systems, pp. 13-16, May 1995.
Feng Chen, et al., "A 0.25-mW Low-Pass Passive Sigma-Delta Modulator with Built-In Mixer for a 10-MHz IF Input" IEEE Journal of Solid-State Circuits, vol. 32, No. 6, pp. 774-782, Jun. 1997.
Abhijit Das, et al., "A 4th-Order 86dB CT Sigma-Delta ADC with Two Amplifiers in 90 nm CMOS" IEEE International Solid-State Circuits Conference, Feb. 2005.
Jinseok Koh, et al., "A 66dB DR 1.2V 1.2mW Single-Amplifier Double-Sampling 2nd-Order Sigma-Delta ADC for WCDMA in 90 nm CMOS" IEEE International Solid-State Circuits Conference, Feb. 2005.
Feng Chen, et al., "A 1.5V 1mA 80dB Passive Sigma-Delta ADC in 0.13um Digital CMOS Process" IEEE International Solid-State Circuits Conference, Feb. 2003.

* cited by examiner

*Primary Examiner*—Lam T Mai
(74) *Attorney, Agent, or Firm*—Ronald O. Neerings; Wade James Brady, III; Frederick J. Telecky, Jr.

(57) ABSTRACT

A discrete-time, single-amplifier, second-order, delta-sigma analog-to-digital converter (DT-SADS ADC) and a method of operating the same. The DT-SADS ADC combines switched-capacitor input sampling with switched-capacitor feedback and passive summing junction capacitor integration.

20 Claims, 7 Drawing Sheets

DISCRETE-TIME, SINGLE-AMPLIFIER, SECOND-ORDER, DELTA-SIGMA ANALOG-TO-DIGITAL CONVERTER AND METHOD OF OPERATION THEREOF

TECHNICAL FIELD OF THE INVENTION

The invention is directed, in general, to analog-to-digital converters (ADCs) and, more specifically, to a discrete-time, single-amplifier, second-order, delta-sigma ADC (DT-SADS ADC) and a method of operating the same.

BACKGROUND OF THE INVENTION

Mobile telephone technology has greatly advanced in recent years, as evident by the higher performance digital mobile telephones now available. To a large extent, these advances stem from the widespread deployment of modern digital wireless modulation technologies, such as time division multiple access (TDMA), code division multiple access (CDMA) technologies including conventional CDMA, wideband CDMA (WCDMA) and CDMA2000 standards and personal communications service (PCS) modulation. The carrier frequencies for these modulated signals ranges from on the order of 800 MHz to as high as 2.0 GHz. These and other digital modulation and communications techniques have greatly improved wireless telephone services, at reduced cost to the consumer. All of the aforementioned technologies require that signals be converted from analog to digital form.

An analog input signal can be converted into a digital output word using an analog-to-digital converter (ADC), which contains a mixture of analog and digital circuitry. The speed, resolution and linearity of the conversion affect the accuracy with which the digital output word represents the analog input signal. The conversion speed must be high enough to sample the shortest analog input signal period (highest analog signal frequency) at least twice. The number of bits in the digital output word determines the conversion resolution and has to be large enough to resolve the maximum peak-to-peak analog input signal into a required degree of granularity. The conversion linearity has to be sufficient to operate at or preferably below a required maximum level of distortion associated with the conversion process.

Several different algorithms and architectures exist that may be employed to accomplish a conversion. These include delta-sigma, successive approximation, pipeline and flash ADCs in increasing order of bandwidth capability but typically decreasing order of resolution capability. Of particular interest is the delta-sigma ADC, which typically provides a reasonable trade-off between sampling rate and bits of resolution while providing a low component count that benefits cost of production, size and reliability.

The delta-sigma (or sigma-delta) ADC employs delta-sigma modulation techniques that digitize an input signal using very low resolution (one-bit) and a very high sampling rate (often in the megahertz range). Oversampling and the use of digital filters increases the resolution to as many as twenty or more bits. It is especially useful for high resolution conversion of low to moderate frequency signals as well as low distortion conversion of signals containing audio frequencies due to its inherent qualities of good linearity and high accuracy.

Delta-sigma ADCs may operate in discrete time or continuous time. In either case, the delta-sigma ADC employs an input modulator and an output digital filter and decimator. The input modulator operates by accepting an input signal through an input summing junction, which feeds a loop filter. The loop filter basically provides an integrated value of this signal to a quantizer, which is typically implemented as a comparator. The quantizer output signal is fed back to the input summing junction through a circuit that acts as a one-bit digital-to-analog converter (DAC). This feedback loop forces the average of the feedback signal to be substantially equal to the input signal. The number of feedback loops in the loop filter (which is the same as the number of integrators) determines the order of the delta-sigma ADC. In the case of a one-bit quantizer, the density of "ones" in the quantizer output signal is proportional to the value of the input signal. The input modulator oversamples the input signal by clocking the comparator at a rate that is much higher than the Nyquist rate. Then, the output digital filter and decimator produce output data words at a data rate appropriate to the conversion.

Without careful optimization, existing discrete-time second-order order delta-sigma ADC designs that employ an amplifier in each integrator (a total of two amplifiers) often consume excessive integrated circuit (IC) chip area and power. Careful optimization can be time consuming and may require a mature process technology that has been thoroughly characterized. Reducing the number of amplifiers can result in reduced chip area and power consumption. Unfortunately, existing discrete-time second-order order delta-sigma ADC designs that employ fewer than two amplifiers are often vulnerable to real-world operating conditions, or "non-idealities," such as mismatch, noise and non-linearity.

One existing discrete-time second-order order delta-sigma ADC design is the passive delta-sigma modulation (PDSM) ADC (see, e.g., Chen, et al., "A 0.25 mW 13-bit passive SD modulator for a 10 MHz IF input," in ISSCC Dig. Tech. Papers, February 1996; and Chen, et al., "A 1.5V 1 mA 80 dB Passive SD ADC in 0.13 mm Digital CMOS Process," in ISSCC Dig. Tech. Papers, February 2003). PSDM ADCs are subject to comparator offset and flicker-noise and excess delay in the feedback loop. Comparator offset and flicker-noise are typically reduced using offset storage cancellation, chopping or correlated double-sampling. Thermal noise must also be reduced, resulting in large high-current preamplifiers. Offset reduction techniques can consume too much power and area. Further, the timing the offset reduction techniques require may limit the maximum sample rate ($F_s$). Excess loop delay is avoided by requiring each preamplifier 3 dB-bandwidth to be greater than $F_s$. Then, the feedback delay must be fixed and less than or equal to half of the sample period ($T_s=1/F_s$).

Another existing discrete-time second-order order delta-sigma ADC design is the active-passive delta-sigma modulation (APDSM) ADC (see, e.g., U.S. Patent Publication No. 20050116850, "Continuous Time Fourth Order Delta Sigma Analog-to-Digital Converter;" and Das, et al., "A 4th-order 86 dB CT SD ADC with Two Amplifiers in 90 nm CMOS," in ISSCC Dig. Tech. Papers, February 2005). APSDM ADCs are subject to resistor and capacitor absolute value variances and excess loop delay and parasitic poles. Variances in resistor and capacitor absolute value tend to cause large absolute ADC gain variations and the movement of poles and zeros, which degrades performance and stability. Counteracting these vulnerabilities requires extra circuitry to control the reference voltage so that the absolute gain of the ADC does not vary substantially, typically less than ±1 dB. Without this circuitry, the absolute gain may vary by as much as ±6 dB. Excess loop delay and parasitic poles vulnerabilities require the amplifier, comparator, and DAC to meet delay requirements over an expected range of $F_s$. The feedback delay must be fixed and less than or equal to half of $T_s$. Further, a loop delay compensation circuit may be required to reduce sensitivity to quantizer metastability, latch clock-to-Q time, and feedback DAC propagation delay.

Both PSDM and APSDM ADCs may require that the input common mode voltage be level-shifted for proper operation and reliability. This requires additional circuits for level-shifting, which consume additional chip area and power.

Yet another existing discrete-time second-order order delta-sigma ADC design is the single-amplifier delta-sigma modulation (SASD) ADC (see, e.g., U.S. Patent Publication No. 20040169596, "Higher Order Delta-sigma Analog-to-Digital Converter Based on Finite Impulse Response Filter;" and Koh, et al., "A 66 dB DR 1.2V 1.2 mW Single-Amplifier Double-Sampling second-order SD ADC for WCDMA in 90 nm CMOS" in ISSCC Dig. Tech. Papers, February 2005). SASD ADCs are subject to non-idealities in the linearity of amplification and gain, DC offset, limits on DC gain, gain-bandwidth product and slew rate, high input referred noise and sensitivity to capacitor mismatch, a data-dependent offset at the amplifier input in cases involving double sampling and increased total harmonic distortion. All of these can cause high-frequency noise to fold into the signal band and ultimately limit the achievable signal-to-noise ratio (SNR) and signal to noise-plus-distortion ratio (SNDR).

SUMMARY OF THE INVENTION

To address the above-discussed deficiencies of the prior art, one aspect of the invention provides a discrete-time, single-amplifier, second-order, delta-sigma ADC (DT-SADS ADC). In one embodiment, the converter includes: (1) a passive integrator unit having a passive input sampling circuit and a first passive feedback sampling circuit and a first passive summing junction coupling the passive input sampling circuit and the first passive feedback sampling circuit, (2) an active integrator unit coupled to an output of the passive integrator unit and having an active sampling circuit, a second passive feedback sampling circuit and a second passive summing junction coupling the active sampling circuit and the second passive feedback sampling circuit, (3) a quantizer coupled to an output of the active integrator unit, (4) a digital-to-analog converter coupled to an output of the quantizer and (5) a clock generator coupled to an output of the quantizer and configured to generate clock signals: (5a) concurrently to cause the passive input sampling circuit to gather samples from an input of the converter, cause the active sampling circuit to gather samples from the output of the passive integrator unit and cause the first and second passive feedback sampling circuits to gather samples from an output of the digital-to-analog converter and (5b) thereafter concurrently to cause the passive input sampling circuit and the first passive feedback sampling circuit to transfer the samples to the first passive summing junction and cause the active sampling circuit and the second passive feedback sampling circuit to transfer the samples to the second passive summing junction.

In another embodiment, the converter includes: (1) a passive integrator unit having an input capacitor and a first feedback capacitor and a first passive summing junction coupling the input capacitor and the first feedback capacitor, (2) an active integrator unit coupled to an output of the passive integrator unit and having an operational transconductance amplifier, a second feedback capacitor and a second passive summing junction coupling the operational transconductance amplifier and the second feedback capacitor, (3) a quantizer coupled to an output of the active integrator unit, (4) a digital-to-analog converter coupled to an output of the quantizer and (5) a clock generator coupled to an output of the quantizer and configured to generate clock signals: (5a) concurrently to cause the input capacitor to gather samples from an input of the converter, cause the operational transconductance amplifier to gather samples from the output of the passive integrator unit and cause the first and second feedback capacitors to gather samples from an output of the digital-to-analog converter and (5b) thereafter concurrently to cause the input capacitor and the first feedback capacitor to transfer the samples to the first passive summing junction and cause the operational transconductance amplifier and the second feedback capacitor to transfer the samples to the second passive summing junction.

Another aspect of the invention provides a method of operating a DT-SADS ADC having: (1) a passive integrator unit having a passive input sampling circuit and a first passive feedback sampling circuit and a first passive summing junction coupling the passive input sampling circuit and the first passive feedback sampling circuit, (2) an active integrator unit coupled to an output of the passive integrator unit and having an active sampling circuit, a second passive feedback sampling circuit and a second passive summing junction coupling the active sampling circuit and the second passive feedback sampling circuit, (3) a quantizer coupled to an output of the active integrator unit and (4) a digital-to-analog converter coupled to an output of the quantizer. In one embodiment, the method includes: (1) concurrently causing the passive input sampling circuit to gather samples from an input of the converter, the active sampling circuit to gather samples from the output of the passive integrator unit and the first and second passive feedback sampling circuits to gather samples from an output of the digital-to-analog converter and (2) thereafter concurrently causing the passive input sampling circuit and the first passive feedback sampling circuit to transfer the samples to the first passive summing junction and the active sampling circuit and the second passive feedback sampling circuit to transfer the samples to the second passive summing junction.

BRIEF DESCRIPTION OF THE DRAWINGS

For a more complete understanding of the invention, reference is now made to the following descriptions taken in conjunction with the accompanying drawings, in which.

DETAILED DESCRIPTION

Various embodiments to be illustrated and described are directed to a DT-SADS ADC in which switched-capacitor input sampling is combined with switched-capacitor feedback and passive summing junction capacitor integration.

Figure 1A:
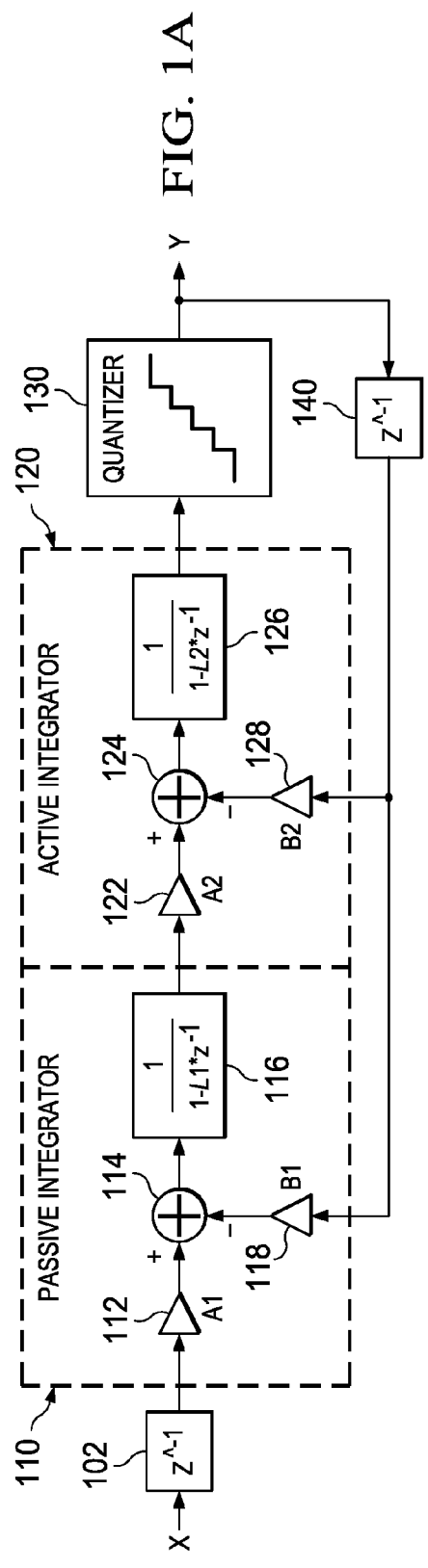
FIG. 1A is a block diagram of one embodiment of a DT-SADS ADC.

FIG. 1A is a block diagram of one embodiment of a DT-SADS ADC. The DT-SADS ADC receives an input signal X that has been low-pass filtered with a filter 102. The DT-SADS ADC includes a passive integrator unit 110, an active integrator unit 120, a quantizer 130 and a DAC 140. The passive integrator unit 110 contains a passive input sampling circuit 112 that receives and samples the input signal. The passive input sampling circuit 112 provides the sampled input signal to a first summing junction 114. The output of the first summing junction 114 is stored in a first summing junction integrator 116. A loop filter (which includes the DAC 140) contains first and second feedback loops. The first feedback loop feeds a feedback signal back to the passive integrator unit 110 through a first passive feedback sampling circuit 118, where it is sampled and subtracted from the sampled input signal provided to the first summing junction 114 by the passive input sampling circuit 112.

The active integrator unit 120 contains an active sampling circuit 122 that receives and samples the output of the passive integrator unit 110. The active sampling circuit 122 provides the sampled output to a second summing junction 124. The output of the second summing junction 124 is stored in a second summing junction integrator 126. The second feedback loop of the loop filter feeds the feedback signal back to the active integrator unit 120 through a second passive feedback sampling circuit 128, where it is sampled and subtracted from the sampled output provided to the second summing junction 124 by the active sampling circuit 122.

The quantizer 130 is a single-bit quantizer. The quantizer 130 quantizes the output from the active integrator unit 120 into a one-bit output signal Y. In addition to constituting the output of the DT-SADS ADC, the output signal is provided to the DAC 140, which provides the feedback signal that is fed back to the passive and active integrator units 110, 120. As stated above, the density of "ones" in the output signal Y is proportional to the value of the input signal X.

In an alternative embodiment, the quantizer 130 is a multi-bit quantizer. The quantizer 130 quantizes the output from the active integrator unit 120 into a multi-bit output signal Y. As above, the output signal not only constitutes the output of the DT-SADS ADC, but is provided to the DAC 140, which provides the feedback signal that is fed back to the passive and active integrator units 110, 120. In this embodiment, Dynamic-Element-Matching (DEM) may be required to noise-shape or suppress any non-linear error due to capacitive mismatch with the DAC 140. Two conventional DEM capacitive-matching techniques are Individual Level-Averaging (ILA) and Data-Weighted-Averaging (DWA). ILA is addressed in Leung, "Architectures for Multi-bit Oversampling A/D Converter Employing Dynamic Element Matching Techniques," 1991 IEEE International Symposium on Circuits and Systems, pp. 1657-1660 (May, 1991). DWA is addressed in Baird, et al., "Improved ΔΣ DAC Linearity Using Data Weighted Averaging," IEEE International Symposium on Circuits and Systems, pp. 13-16 (May, 1995), incorporated herein by reference.

Figure 1B:
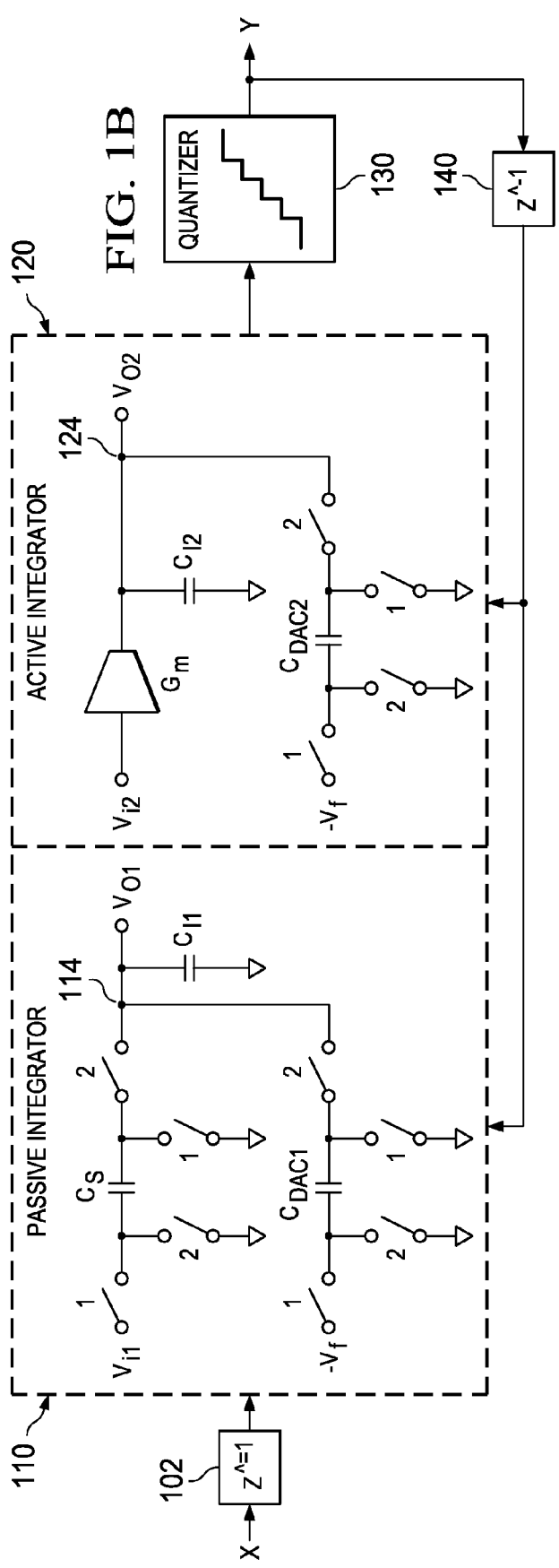
FIG. 1B is a block diagram of the DT-SADS ADC of FIG. 1A setting forth schematic diagrams for one embodiment of passive and active integrator units therein.

FIG. 1B is a block diagram of the DT-SADS ADC of FIG. 1A setting forth schematic diagrams for one embodiment of passive and active integrator units therein. The embodiment of FIG. 1B is single-ended. However, those skilled in the pertinent art will recognize that a differential DT-SADS ADC would typically be expected to provide superior rejection of common-mode noise and exhibit greater linearity.

The filter 102, quantizer 130 and DAC 140 are represented the same as in FIG. 1A. The passive integrator unit 110 and the active integrator unit 120 are instead illustrated as containing specific components that perform the functions described in conjunction with FIG. 1A.

Regarding the passive integrator unit 110, an input capacitor $C_S$ acts as the passive input sampling circuit 112. A summing junction capacitor $C_{I1}$ acts as the first summing junction integrator 116. A first feedback capacitor $C_{DAC1}$ acts as the first passive feedback sampling circuit 118. The output voltage, $V_{o1}$, of the passive integrator unit 110 is given by:

$$V_{o1}=1/(1-L_1z^{-1})\cdot[A_1\cdot V_{i1}-B_1\cdot V_f],$$

where $L_1$ is the leakage in the first summing junction integrator 116, $A_1$ is an input coefficient, $V_{i1}$ is the voltage of the filtered input signal X, $B_1$ is a feedback coefficient, and $V_f$ is the reference voltage for the DAC 140. $L_1$, $A_1$ and $B_1$ are given as follows:

$$L_1=C_{I1}/(C_{I1}+C_S+C_{DAC1}),$$

$$A_1=C_S/C_{I1}, \text{ and}$$

$$B_1=C_{DAC1}/C_{I1}.$$

The absolute gain, ABSG, of the passive integrator unit 110 is approximately the ratio of the feedback coefficient, $B_1$, divided by the input coefficient, $A_1$. Thus:

$$ABSG \approx C_{DAC1}/C_S.$$

The value of the passive integrating capacitor $C_{I1}$ establishes the pole of the first feedback loop and removes the need for an amplifier in the passive integrator unit 110. The transfer function of the first feedback loop is:

$$H_1(z)=1/(1-C_{I1}/(C_{I1}+C_S+C_{DAC1})\cdot z^{-1})$$

If $C_{I1} >> C_S+C_{DAC1}$, then:

$$H_1(z) \approx 1/(1-z^{-1}).$$

Turning to the active integrator unit 120, an operational transconductance amplifier (OTA) $G_m$ along with an integrating capacitor $C_{I2}$ forms a transconductance-capacitance, ($G_m$–C) integrator, which acts as the second summing junction integrator 126. A second feedback capacitor $C_{DAC2}$ acts as the second passive feedback sampling circuit 128. The output voltage, $V_{o2}$, of the active integrator unit 120 is given by:

$$V_{O2}=1/(1-L_2z^{-1})\cdot[A_2\cdot V_{i2}-B_2\cdot V_f],$$

where $L_2$ is the leakage in the second summing junction integrator 126, $A_2$ is an input coefficient, $V_{i2}=V_{o1}$, and $B_2$ is a feedback coefficient. $L_2$, $A_2$ and $B_2$ are given as follows:

$$L_2=C_{I2}/(C_{I2}+C_{Gm}+C_{DAC2}),$$

$$A_2=C_{Gm}/C_{I2}, \text{ and}$$

$$B_2=C_{DAC2}/C_{I2}.$$

The ABSG of the active integrator unit 120 is approximately the ratio of the feedback coefficient $B_2$ over the input coefficient $A_2$. Thus:

$$ABSG \approx C_{DAC2}/C_{Gm}.$$

The OTA $G_m$ of the illustrated embodiment does not experience significant input or output variations, even when the input signal X is full-scale. Consequently, $G_m$ is not required to have a high slew-rate or a fast settling time. Instead, $G_m$ has only to establish a non-dominant pole greater than the maximum sample rate, $F_s$. In one embodiment, the input common mode of $G_m$ is biased, e.g., using a switched-capacitor.

The transfer function of the first feedback loop is:

$$H_2(z) = C_{Gm}/C_{I2}(1-1/(1+C_{DAC2}/C_{I2})z^{-1}).$$

If $C_{I2} >> Cz$, then:

$$H_2(z) \approx C_{Gm}/C_{I2}(1-z^{-1}).$$

One embodiment employs a relatively large summing junction capacitor, $C_{I1}$, and a large integration capacitor, $C_{I2}$, to reduce the input and output variation of the OTA $G_m$ to decrease distortion. An alternative embodiment employs relatively small $C_{I1}$ and $C_{I2}$ to increase the input signal bandwidth the DT-SADS ADC can accommodate.

Figure 2:
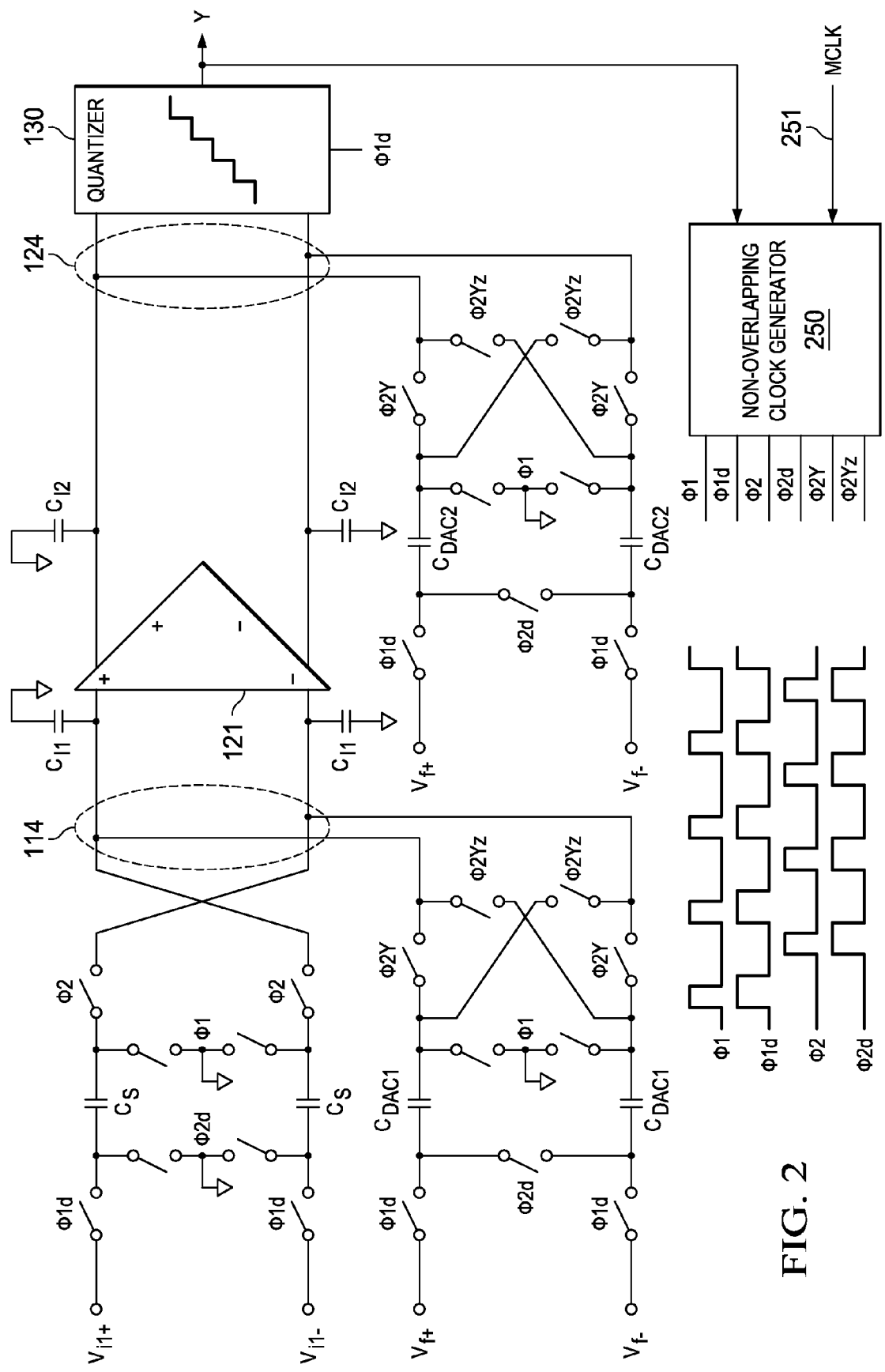
FIG. 2 is a circuit diagram of one embodiment of the DT-SADS ADC of FIG. 1A further including one embodiment of a clock generator for the ADC and one embodiment of clock signal timing diagrams for the clock generator.

The signal transfer function (STF) for the DT-SADS ADC of FIG. 2 is:

$$STF = \frac{A_2 \cdot A_1 \cdot Z^{-1}}{1+(A_2 \cdot B_1 + B_2 - L_1 - L_2)z^{-1}+(L_1 \cdot L_2 - L_1 \cdot B_2)z^{-2}}.$$

The DC STF is:

$$STF_{DC} = ABSG = (A_1 \cdot A_2)/(1+(A_2 \cdot B_1 + B_2 - L_1 - L_2) + (L_1 \cdot L_2 - L_1 \cdot B_2))$$

The noise transfer function (NTF) for the DT-SADS ADC of FIG. 2 is:

$$NTF = \frac{(1 - L_1 \cdot z^{-1})(1 - L_2 \cdot z^{-1})}{1+(A_2 \cdot B_1 + B_2 - L_1 - L_2)z^{-1}+(L_1 \cdot L_2 - L_1 \cdot B_2)z^{-2}}$$

The STF and NTF poles for the loop filter of the DT-SADS ADC of FIG. 2 are:

$$P_1 = \frac{-(A_2 * B_1 + B_2 - L_1 - L_2) - \sqrt{(A_2 \cdot B_1 + B_2 - L_1 - L_2)^2 - 4(L_1 \cdot L_2 - L_1 \cdot B_2)}}{2}, \text{ and}$$

$$P_2 = \frac{-(A_2 * B_1 + B_2 - L_1 - L_2) + \sqrt{(A_2 \cdot B_1 + B_2 - L_1 - L_2)^2 - 4(L_1 \cdot L_2 - L_1 \cdot B_2)}}{2}.$$

The NTF zeroes for the loop filter of the DT-SADS ADC of FIG. 2 are:

$$Z_1 = L_1 = C_{I1}/(C_{I1}+C_S+C_{DAC1}), \text{ and}$$

$$Z_2 = L_2 = C_{I2}/(C_{I2}+C_{DAC2}).$$

Figure 4:
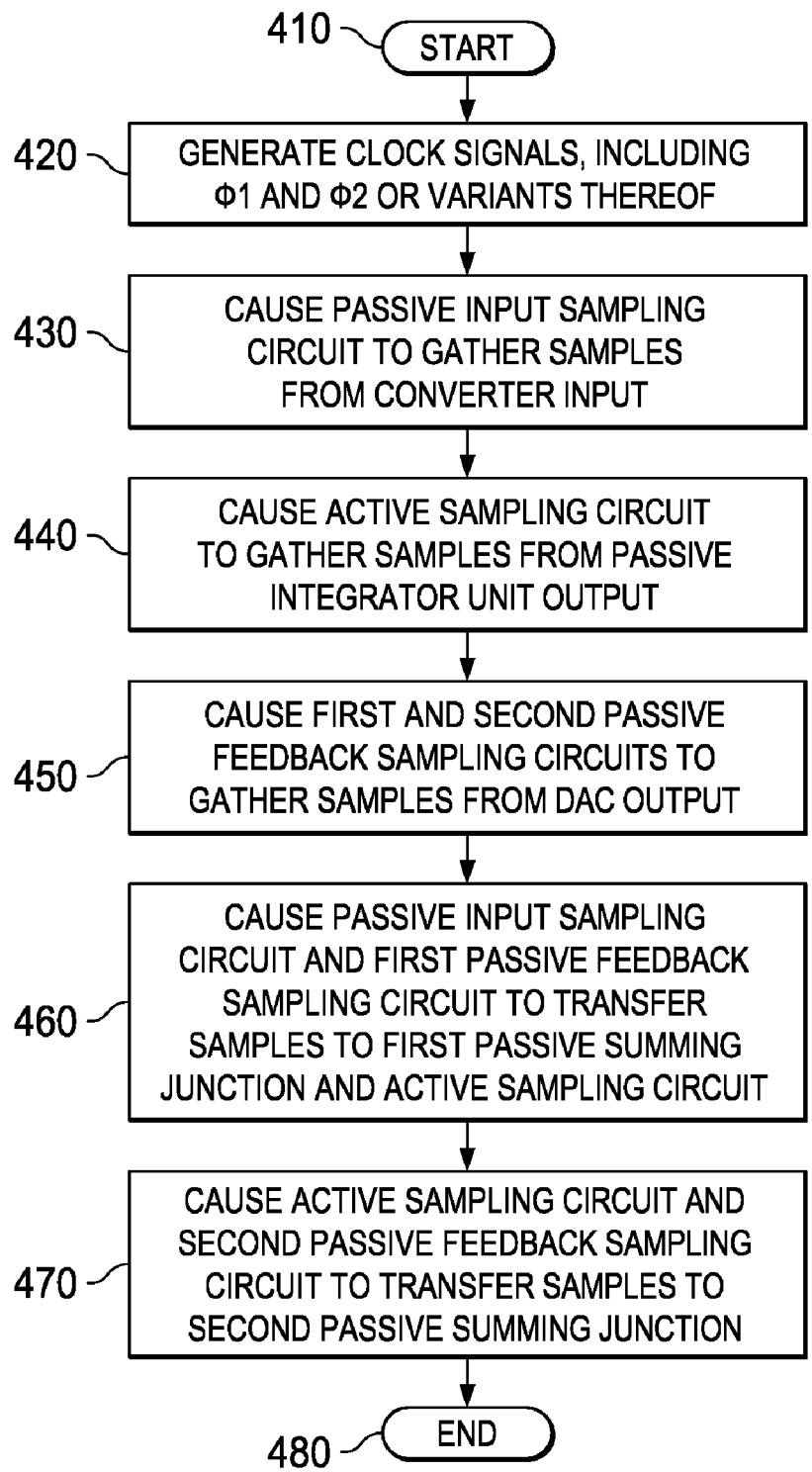
FIG. 4 is a flow diagram of one embodiment of a method of operating a DT-SADS ADC.

As stated above, the DT-SADS ADC combines switched-capacitor input sampling with switched-capacitor feedback and passive summing junction capacitor integration. Accordingly, a first plurality of unreferenced switches interposes the input capacitor $C_S$, the input of the passive integrator unit 110, the first summing junction 114 and static voltage references. A second plurality of unreferenced switches interpose the first feedback capacitor $C_{DAC1}$, the DAC 140, the first summing junction 114 and static voltage references. A third plurality of unreferenced switches interpose the second feedback capacitor $C_{DAC2}$, the DAC 140, the second summing junction 124 and static voltage references. Though not shown in FIG. 1B, a fourth plurality of switches are coupled to control inputs the OTA $G_m$. FIG. 4 will show the fourth plurality of switches.

The first, second and third pluralities of switches are labeled "1" and "2" to designate whether a clock signal Φ1 or Φ2, or a variant of Φ1 or Φ2, drives them. The clock signals Φ1 and Φ2 are non-overlapping. When Φ1 is asserted, the first plurality of switches close to couple the input capacitor $C_S$ between $V_{i1}$ (the voltage of the filtered input signal X) and a static voltage reference, the second plurality of switches close to couple the first feedback capacitor $C_{DAC1}$ between $-V_f$ (the voltage of the feedback signal) and a static voltage reference, the third plurality of switches close to couple the second feedback capacitor $C_{DAC2}$ between $-V_f$ and a static voltage reference and the fourth plurality of switches close to couple an input of the OTA $G_m$ to $V_{i2}$. While Φ1 is asserted, $C_S$ samples $V_{i1}$, $G_m$ samples $V_{i2}$, and $C_{DAC1}$ and $C_{DAC2}$ sample $-V_f$. The pluralities of switches driven by Φ2 are of course open during assertion of Φ1.

When Φ2 is asserted, the first plurality of switches close to couple the input capacitor $C_S$ between the first summing node 114 and a static voltage reference, the second plurality of switches close to couple the first feedback capacitor $C_{DAC1}$ between the first summing node 114 and a static voltage reference, the third plurality of switches close to couple the second feedback capacitor $C_{DAC2}$ between the second summing node 124 and a static voltage reference and the fourth plurality of switches close to couple an output of the OTA $G_m$ to the second summing node 124. While Φ2 is asserted, $C_S$ delivers its sample of $V_{i1}$ to the first summing node 114, $C_{DAC1}$ delivers its sample of $-V_f$ to the first summing node 114, $C_{DAC2}$ delivers its sample of $-V_f$ to the second summing node 124 and $G_m$ delivers its sample of $V_{i2}$ to the integrating capacitor $C_{I2}$. The pluralities of switches driven by Φ1 are of course open during assertion of Φ2.

Thus, while Φ2 is asserted, $C_{I1}$ integrates the difference between the $V_{i1}$ and $V_f$ samples to yield $V_{o1}$, and $C_{I2}$ integrates the difference between the sampled $V_{i2}$ and $V_f$ samples to yield $V_{o2}$. These integrated differences are passed on through the DT-SADS ADC: $V_{o1}$ passes to the active integrator unit 120, and $V_{o2}$ passes to the quantizer 130.

FIG. 2 is a circuit diagram of one embodiment of the DT-SADS ADC of FIG. 1A further including one embodiment of a non-overlapping clock generator 250 for the ADC and one embodiment of clock signal timing diagrams for the clock generator. FIG. 2 shows a differential DT-SADS ADC having positive and negative rails. Therefore, $V_{i1}$ becomes $V_{i1+}$ and $V_{i1-}$ and $V_f$ becomes $V_{f+}$ and $V_{f-}$. Counterparts of $C_S$, $C_{I1}$ and $C_{I2}$ are provided for each rail.

The clock generator 250 produces non-overlapping clock signals Φ1, Φ1d, Φ2, Φ2d, Φ2Y and Φ2Yz based on the output signal Y received from the quantizer 130 and a master clock signal MCLK. FIG. 2 shows sample timing diagrams for Φ1, Φ1d, Φ2 and Φ2d. It can be seen that Φ1 and Φ2 are non-overlapping. The rising edges of Φ1d (a variant of Φ1) coincide with those of Φ1, but the falling edges of Φ1d are delayed with respect to those of Φ1. Likewise, the rising edges of Φ2d (a variant of Φ2) coincide with those of Φ2, and the falling edges of Φ2d are delayed with respect to those of Φ2. The falling edges of Φ1d and Φ2d are delayed to ensure that samples are substantially transferred from $C_S$, $C_{DAC1}$ and $C_{DAC2}$ forward through the DT-SADS ADC.

While Φ1 is asserted, the input capacitors Cs sample $V_{i1+}$ and $V_{i1-}$, the OTA $G_m$ samples the voltage of the summing junction capacitors $C_{I1}$, the first feedback capacitors $C_{DAC1}$ sample $V_{f+}$ and $V_{f-}$, and the second feedback capacitors $C_{DAC2}$ sample $V_{f+}$ and $V_{f-}$. While Φ2 is asserted, the input capacitors $C_S$ delivers their samples of $V_{i1+}$ and $V_{i1-}$ to the first summing node 114, the first feedback capacitors $C_{DAC1}$ delivers their samples of $V_{f+}$ and $V_{f-}$ to the first summing node 114, the second feedback capacitors $C_{DAC2}$ delivers their samples of $V_{f+}$ and $V_{f-}$ to the second summing node 124 and $G_m$ delivers its samples of the voltage of the summing junction capacitors $C_{I1}$ to the integrating capacitors $C_{I2}$.

Although not shown in FIG. 2, Φ2Y and Φ2Yz are always inverse to one another. Φ2Y is the same as Φ2 if the output of the quantizer 130 is one, and Φ2Yz is the same as Φ2 if the output of the quantizer 130 is zero. An asserted Φ2Y directly couples the positive-rail $C_{DAC1}$ to the positive rail of the first summing junction 114, the negative-rail $C_{DAC1}$ to the negative rail of the first summing junction 114, the positive-rail $C_{DAC2}$ to the positive rail of the second summing junction 124 and the negative-rail $C_{DAC2}$ to the negative rail of the second summing junction 124. An asserted Φ2Yz cross-couples the positive-rail $C_{DAC1}$ to the negative rail of the first summing junction 114, the negative-rail $C_{DAC1}$ to the positive rail of the first summing junction 114, the positive-rail $C_{DAC2}$ to the negative rail of the second summing junction 124 and the negative-rail $C_{DAC2}$ to the positive rail of the second summing junction 124. Φ2Y and Φ2Yz therefore ensure that the sign of the feedback signal is correct at the first and second summing nodes 114, 124.

Figure 3:
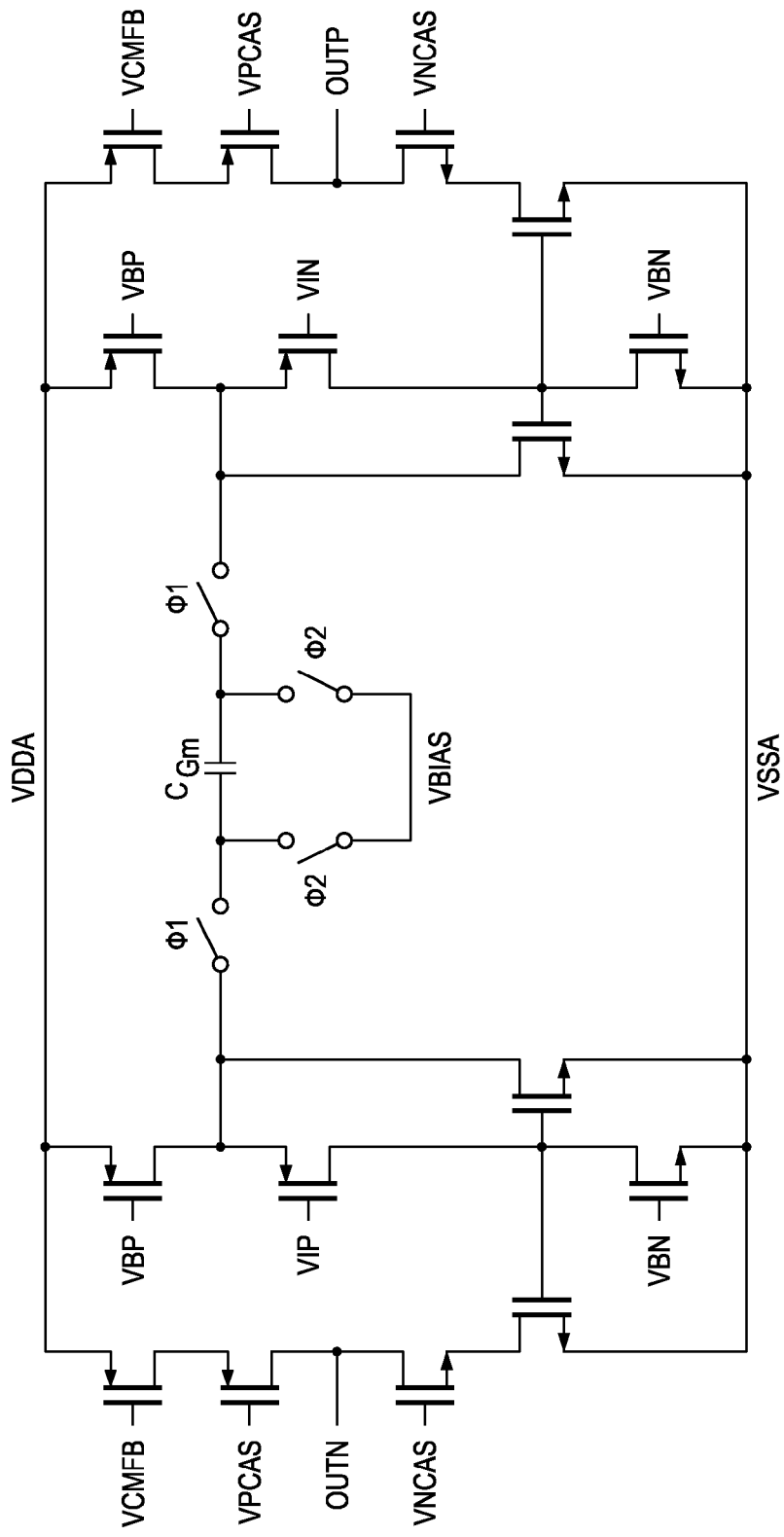
FIG. 3 is a circuit diagram of one embodiment of an operational transconductance amplifier for the DT-SADS ADC of FIG. 1A.

FIG. 3 is a circuit diagram of one embodiment of an OTA for the DT-SADS ADC of FIG. 1A. The OTA has positive- and negative-rail inputs VIP and VIN and positive- and negative-rail outputs OUTP and OUTN. FIG. 4 shows the fourth plurality of switches coupled to control inputs the OTA $G_m$ and labeled to indicate that clock signals Φ1 and Φ2 drive them.

The OTA of FIG. 3 employs a negative feedback loop to regulate its transconductance to the switched-capacitor conductance set by the switch-capacitor source-degeneration circuit. Thus, the effective transconductance of the OTA is equal to the sample rate, $F_S$, multiplied by the capacitor $C_{Gm}$, that is, $G_m=F_S \cdot C_{Gm}$. The OTA therefore functions essentially as a $G_m$–C integrator, which as stated above establishes the pole of the second feedback loop.

Capacitor ratios set the $G_m/C_{I2}$ frequency and OTA output variation. The OTA of FIG. 3 operates according to the following relationships:

$$G_m = F_s \cdot C_{Gm}$$

$$G_m/C_{I2} = F_s \cdot C_{Gm}/C_{I2}$$

$$H_2(s) = G_m/(s \cdot C_{I2}) = F_s \cdot C_{Gm}/(s \cdot C_{I2}) = C_{Gm}/C_{I2}/(s \cdot T_s)$$

$$H_2(z) = G_m/(F_s \cdot C_{I2})/(1-z^{-1})$$

$$H_2(z) = F_s \cdot C_{Gm}/(F_s \cdot C_{I2})/(1-z^{-1})$$

$$H_2(z) = C_{Gm}/C_{I2} \cdot 1/(1-z^{-1})$$

FIG. 4 is a flow diagram of one embodiment of a method of operating a DT-SADS ADC. The method begins in a start step 410. In a step 420, clock signals are generated, including Φ1 and Φ2 or variants thereof (i.e., Φ1d and Φ2d). In a step 430, the passive input sampling circuit is caused to gather samples from an input of the converter. In a step 440, the active sampling circuit is concurrently (with the step 430) caused to gather samples from the output of the passive integrator unit. In a step 450, the first and second passive feedback sampling circuits are concurrently (with the steps 430 and 440) caused to gather samples from an output of the DAC. In a step 460, the passive input sampling circuit and the first passive feedback sampling circuit are thereafter (after the steps 430, 440, 450) caused to transfer the samples to the first passive summing junction and the active sampling circuit. In a step 470, the active sampling circuit and the second passive feedback sampling circuit are concurrently (with the step 460) caused to transfer the samples to the second passive summing junction. The method ends in an end step 480.

A particular embodiment of the DT-SADS ADC was simulated using Simulink, which is commercially available from The MathWorks of Natick, Mass. Table 1 sets forth parameter values used in the simulation:

TABLE 1

Parameter Values Used in Simulation

| Parameter Name | Parameter Value | Units |
|---|---|---|
| $C_S$ | 100 | fF |
| $C_{I1}$ | 20 | pF |
| $C_{DAC1}$ | 100 | fF |
| $C_{I2}$ | 10 | pF |
| $C_{DAC2}$ | 50 | fF |
| $C_{Gm}$ | 10 | pF |
| $F_S$ | 500 | MHz |
| $G_m = F_S * C_{Gm}$ | 5 | mA/V |
| N | $2^{16}$ | Samples |
| fin1 | $66 * F_S/N$ | kHz |
| vref | 1 | V peak-differential |
| Ain1 | $10^{(-6/20)} \cdot$ vref | V peak-differential |

Figure 5:
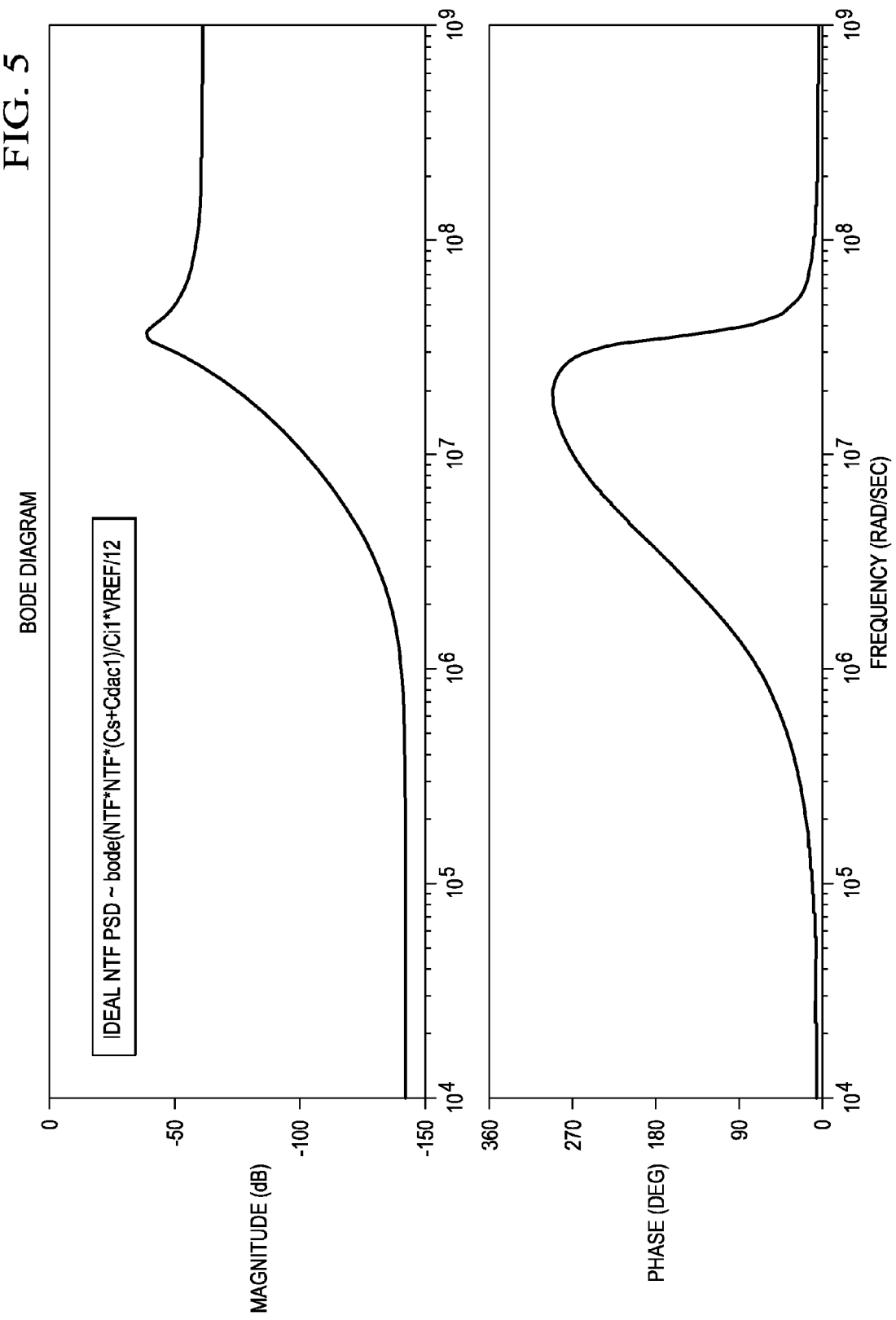
FIG. 5 sets forth Bode magnitude and phase plots of an approximate noise transfer function power spectral density for a simulation of a DT-SADS ADC using predetermined parameter values.
Figure 6:
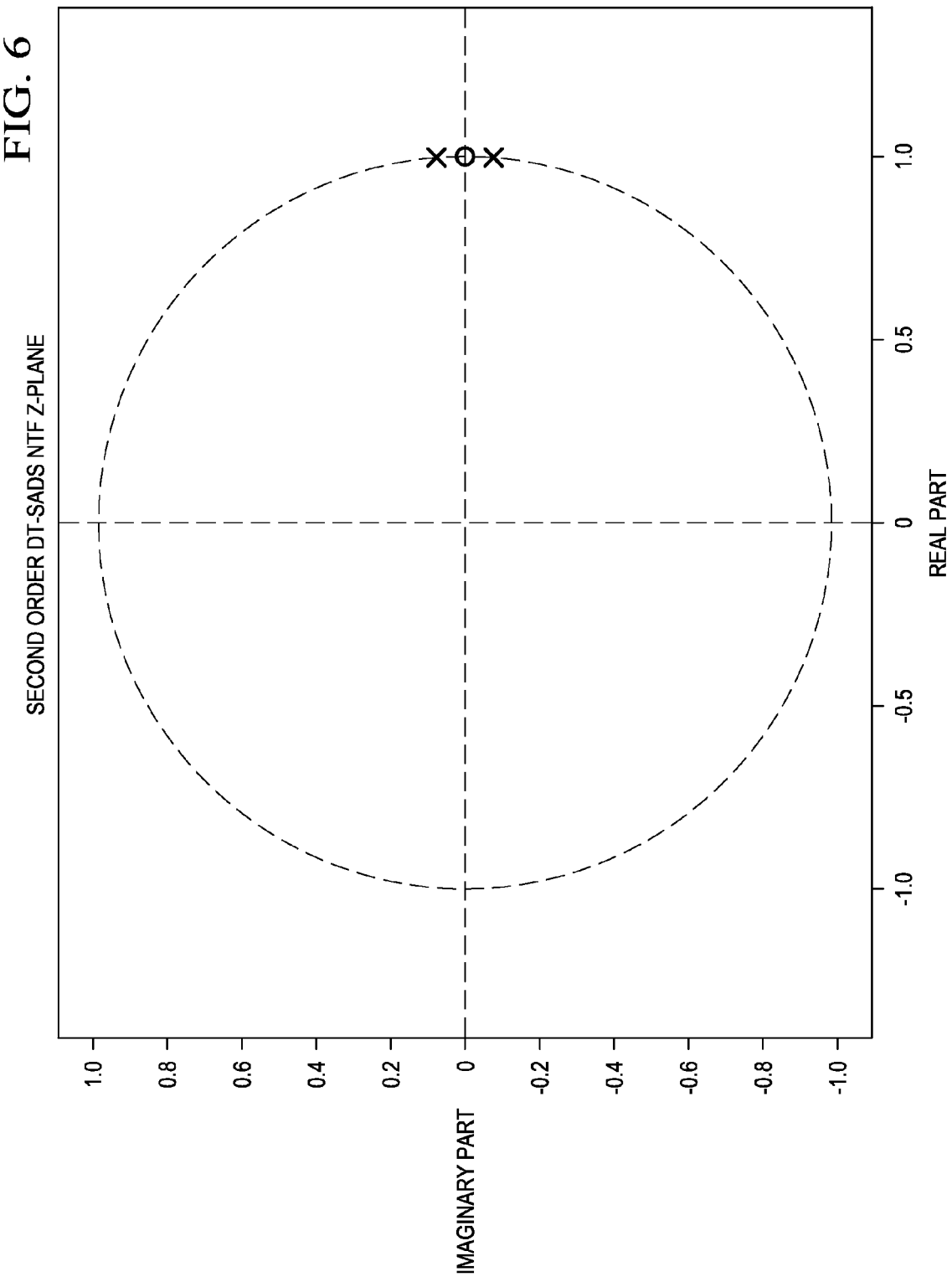
FIG. 6 is a Z-plane pole-zero plot for the DT-SADS ADC of FIG. 5.

FIG. 5 sets forth Bode magnitude and phase plots of an approximate NTF power spectral density (PSD) for the simulation. FIG. 6 is a Z-plane pole-zero plot for the simulation.

Figure 7:
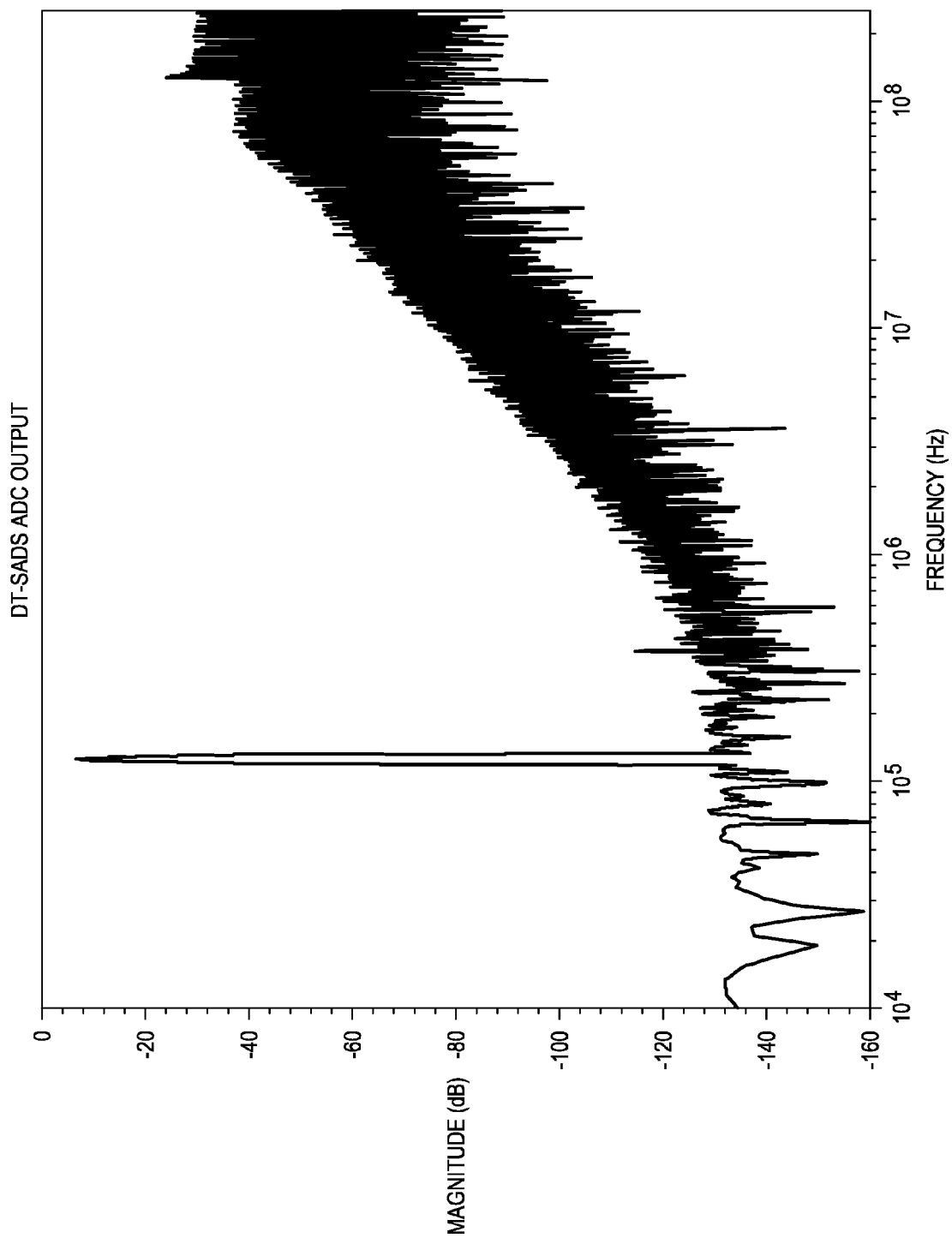
FIG. 7 is a Bode magnitude plot of the output power spectral density of the DT-SADS ADC of FIG. 5.

FIG. 7 is a Bode magnitude plot of the output power spectral density of the DT-SADS ADC of FIG. 5. No significant near harmonics (e.g., third harmonics) are apparent. The simulated DT-SADS ADC appears substantially linear. Table 2, below, sets forth SNDR for the simulated DT-SADS ADC for several input signal bandwidths. The SNDR appears good, even at wide bandwidths.

TABLE 2

SNDR for Several Input Signal Bandwidths

| Signal Bandwidth (kHz) | SNDR (dB) |
|---|---|
| 200 | 110.16 |
| 2500 | 79.23 |
| 5000 | 64.79 |
| 10000 | 49.82 |
| 20000 | 35.21 |

Those skilled in the art to which the invention relates will appreciate that other and further additions, deletions, substitutions and modifications may be made to the described embodiments without departing from the scope of the invention.

What is claimed is:

1. A discrete-time, single-amplifier, second-order, delta-sigma analog-to-digital converter, comprising:
    a passive integrator unit having a passive input sampling circuit and a first passive feedback sampling circuit and a first passive summing junction coupling said passive input sampling circuit and said first passive feedback sampling circuit;
    an active integrator unit coupled to an output of said passive integrator unit and having an active sampling circuit, a second passive feedback sampling circuit and a second passive summing junction coupling said active sampling circuit and said second passive feedback sampling circuit;

a quantizer coupled to an output of said active integrator unit;

a digital-to-analog converter coupled to an output of said quantizer; and a clock generator coupled to an output of said quantizer and configured to generate clock signals:

concurrently to cause said passive input sampling circuit to gather samples from an input of said converter, cause said active sampling circuit to gather samples from said output of said passive integrator unit and cause said first and second passive feedback sampling circuits to gather samples from an output of said digital-to-analog converter, and thereafter concurrently to cause said passive input sampling circuit and said first passive feedback sampling circuit to transfer said samples to said first passive summing junction and cause said active sampling circuit and said second passive feedback sampling circuit to transfer said samples to said second passive summing junction.

2. The converter as recited in claim 1 wherein said passive input sampling circuit and said first and second passive feedback sampling circuits are capacitors.

3. The converter as recited in claim 1 wherein said passive integrator unit further has a first summing junction integrator coupled to said first passive summing junction and said active integrated unit further has a second summing junction integrator coupled to said second passive summing junction.

4. The converter as recited in claim 3 wherein said first and second summing junction integrators are capacitors.

5. The converter as recited in claim 3 wherein a capacitance of said first summing junction integrator establishes a pole of a first feedback loop of said converter.

6. The converter as recited in claim 1 wherein a capacitance of said active sampling circuit establishes a non-dominant pole of a second feedback loop of said converter as greater than a maximum sample rate of said converter.

7. The converter as recited in claim 1 wherein said converter is a differential converter.

8. A method of operating a discrete-time, single-amplifier, second-order, delta-sigma analog-to-digital converter having:

a passive integrator unit having a passive input sampling circuit and a first passive feedback sampling circuit and a first passive summing junction coupling said passive input sampling circuit and said first passive feedback sampling circuit, an active integrator unit coupled to an output of said passive integrator unit and having an active sampling circuit, a second passive feedback sampling circuit and a second passive summing junction coupling said active sampling circuit and said second passive feedback sampling circuit, a quantizer coupled to an output of said active integrator unit, and a digital-to-analog converter coupled to an output of said quantizer, the method comprising:

concurrently causing said passive input sampling circuit to gather samples from an input of said converter, said active sampling circuit to gather samples from said output of said passive integrator unit and said first and second passive feedback sampling circuits to gather samples from an output of said digital-to-analog converter; and thereafter concurrently causing said passive input sampling circuit and said first passive feedback sampling circuit to transfer said samples to said first passive summing junction and said active sampling circuit and said second passive feedback sampling circuit to transfer said samples to said second passive summing junction.

9. The method as recited in claim 8 wherein said passive input sampling circuit and said first and second passive feedback sampling circuits are capacitors.

10. The method as recited in claim 8 wherein said passive integrator unit further has a first summing junction integrator coupled to said first passive summing junction and said active integrated unit further has a second summing junction integrator coupled to said second passive summing junction, said thereafter concurrently causing comprising causing said first and second summing junction integrators to accumulate ones of said samples.

11. The method as recited in claim 10 wherein said first and second summing junction integrators are capacitors.

12. The method as recited in claim 10 wherein a capacitance of said first summing junction integrator establishes a pole of a first feedback loop of said converter.

13. The method as recited in claim 8 wherein a capacitance of said active sampling circuit establishes a non-dominant pole of a second feedback loop of said converter as greater than a maximum sample rate of said converter.

14. The method as recited in claim 8 wherein said concurrently causing and said thereafter concurrently causing are carried out with respect to positive and negative rails of said converter.

15. A discrete-time, single-amplifier, second-order, delta-sigma analog-to-digital converter, comprising:

a passive integrator unit having an input capacitor and a first feedback capacitor and a first passive summing junction coupling said input capacitor and said first feedback capacitor;

an active integrator unit coupled to an output of said passive integrator unit and having an operational transconductance amplifier, a second feedback capacitor and a second passive summing junction coupling said operational transconductance amplifier and said second feedback capacitor;

a quantizer coupled to an output of said active integrator unit;

a digital-to-analog converter coupled to an output of said quantizer; and a clock generator coupled to an output of said quantizer and configured to generate clock signals:

concurrently to cause said input capacitor to gather samples from an input of said converter, cause said operational transconductance amplifier to gather samples from said output of said passive integrator unit and cause said first and second feedback capacitors to gather samples from an output of said digital-to-analog converter, and thereafter concurrently to cause said input capacitor and said first feedback capacitor to transfer said samples to said first passive summing junction and cause said operational transconductance amplifier and said second feedback capacitor to transfer said samples to said second passive summing junction.

16. The converter as recited in claim 15 wherein said passive integrator unit further has a first summing junction capacitor coupled to said first passive summing junction and said active integrated unit further has a second summing junction capacitor coupled to said second passive summing junction.

17. The converter as recited in claim 16 wherein a signal transfer function for said converter is:

$$STF = \frac{A_2 \cdot A_1 \cdot Z^{-1}}{1 + (A_2 \cdot B_1 + B_2 - L_1 - L_2)z^{-1} + (L_1 \cdot L_2 - L_1 \cdot B_2)z^{-2}},$$

where $A_1$ is an input coefficient for said passive integrator unit, $A_2$ is an input coefficient for said active integrator unit, $B_1$ is a feedback coefficient for said passive integrator unit, $B_2$ is a feedback coefficient for said active integrator unit, $L_1$ is a leakage of said first summing junction capacitor and $L_2$ is a leakage of said second summing junction capacitor.

18. The converter as recited in claim 16 wherein a capacitance of said first summing junction capacitor establishes a pole of a first feedback loop of said converter.

19. The converter as recited in claim 15 wherein a capacitance of said operational transconductance amplifier establishes a non-dominant pole of a second feedback loop of said converter as greater than a maximum sample rate of said converter.

20. The converter as recited in claim 15 wherein said converter is a differential converter.

* * * * *